US011881859B2

(12) United States Patent
Gupta et al.

(10) Patent No.: US 11,881,859 B2
(45) Date of Patent: Jan. 23, 2024

(54) SCHMITT TRIGGER CIRCUIT HAVING MISMATCHED INPUT AND SUPPLY

(71) Applicant: TEXAS INSTRUMENTS INCORPORATED, Dallas, TX (US)

(72) Inventors: Abhishek Gupta, Bengalaru (IN); Sayantan Gupta, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/749,278

(22) Filed: May 20, 2022

(65) Prior Publication Data
US 2023/0378942 A1 Nov. 23, 2023

(51) Int. Cl.
*H03K 3/00* (2006.01)
*H03K 3/3565* (2006.01)
*H03K 3/2893* (2006.01)

(52) U.S. Cl.
CPC ......... *H03K 3/3565* (2013.01); *H03K 3/2893* (2013.01)

(58) Field of Classification Search
CPC ........................... H03K 3/3565; H03K 3/2893
See application file for complete search history.

(56) References Cited

U.S. PATENT DOCUMENTS

| 4,481,432 A * | 11/1984 | Davies, Jr. ........ H01L 27/11898 257/E27.11 |
| 5,483,176 A * | 1/1996 | Rodriguez ..... H03K 19/018521 326/83 |
| 6,144,217 A * | 11/2000 | Iwata ............... H03K 19/00361 326/26 |
| 6,870,413 B1 * | 3/2005 | Chang ................. H03K 3/3565 327/205 |
| 10,454,479 B2 * | 10/2019 | Chen .................. H03K 19/0016 |
| 2007/0018696 A1 * | 1/2007 | Lim .................. H03K 19/01721 327/112 |
| 2009/0108877 A1 * | 4/2009 | Kawagoe ............. H03K 3/3565 326/121 |
| 2019/0260361 A1 * | 8/2019 | Rommel ................ H03K 3/012 |

OTHER PUBLICATIONS

Donato et al. A noise-immune sub-threshold circuit design based on selective use of Schmitt-trigger logic. Published 2012.
Cockrill. Understanding Schmitt Triggers. Published Sep. 2011.

* cited by examiner

*Primary Examiner* — Tuan T Lam
(74) *Attorney, Agent, or Firm* — Valerie M. Davis; Frank D. Cimino

(57) ABSTRACT

A circuit includes an inverter coupled between an input and an output. The inverter includes first and second pull-down transistors having control terminals coupled to the input, a pull-up resistor, and a pull-up transistor having a control terminal coupled to the input. The first and second pull-down transistors are coupled in series along a pull-down path extending between a first voltage supply terminal and the output. The pull-up resistor and pull-up transistor are coupled in series along a pull-up path extending between a second voltage supply terminal and the output. A hysteresis transistor has a control terminal coupled to the output. The hysteresis transistor is coupled to the inverter along a hysteresis path extending between the first voltage supply terminal and the pull-up path. A clamp circuit is coupled to the inverter along a clamp path extending between the first voltage supply terminal and the pull-down path.

20 Claims, 5 Drawing Sheets

SCHMITT TRIGGER CIRCUIT HAVING MISMATCHED INPUT AND SUPPLY

BACKGROUND

Many modern devices include various electrical circuits. Some electrical circuits include comparator circuits. One example of a comparator circuit is a Schmitt trigger circuit. A Schmitt trigger circuit may include a plurality of interconnected transistors. The transistors can undergo switching based on an input to the circuit and the switching can determine the output of the circuit. Some Schmitt triggers, known as inverting Schmitt triggers, output a signal that is inverted relative to an input signal. Some other Schmitt triggers, known as non-inverting Schmitt triggers, output a signal that is not inverted relative to an input signal.

SUMMARY

In one example, a circuit includes an input and an output. A first voltage supply terminal is operable to be coupled to a first voltage supply. A second voltage supply terminal is operable to be coupled to a second voltage supply. An inverter is coupled between the input and the output. The inverter includes a first pull-down transistor having a control terminal coupled to the input, a second pull-down transistor having a control terminal coupled to the input, a pull-up resistor, and a pull-up transistor having a control terminal coupled to the input. The first pull-down transistor and the second pull-down transistor are coupled in series along a pull-down path that extends between the first voltage supply terminal and the output. The pull-up resistor and the pull-up transistor are coupled in series along a pull-up path that extends between the second voltage supply terminal and the output. A hysteresis transistor has a control terminal coupled to the output. The hysteresis transistor is coupled to the inverter along a hysteresis path that extends between the first voltage supply terminal and the pull-up path. A clamp circuit is coupled to the inverter along a clamp path that extends between the first voltage supply terminal and the pull-down path.

In one example, a system includes a logic circuit operable to be coupled to a logic voltage supply and a load circuit operable to be coupled to a load voltage supply. A voltage of the load voltage supply is different than a voltage of the logic voltage supply. A buffer circuit is coupled between the logic circuit and the load circuit. The buffer circuit includes an input coupled to the logic circuit and an output coupled to the load circuit. The buffer circuit includes a first voltage supply terminal operable to be coupled to a first voltage supply and a second voltage supply terminal operable to be coupled to the load voltage supply. The buffer circuit includes an inverter coupled between the input and the output. The inverter includes a first pull-down transistor having a control terminal coupled to the input, a second pull-down transistor having a control terminal coupled to the input, a pull-up resistor, and a pull-up transistor having a control terminal coupled to the input. The first pull-down transistor and the second pull-down transistor are coupled in series along a pull-down path that extends between the first voltage supply terminal and the output. The pull-up resistor and the pull-up transistor are coupled in series along a pull-up path that extends between the second voltage supply terminal and the output. A hysteresis transistor has a control terminal coupled to the output. The hysteresis transistor is coupled to the inverter along a hysteresis path that extends between the first voltage supply terminal and the pull-up path. A clamp circuit is coupled to the inverter along a clamp path that extends between the first voltage supply terminal and the pull-down path.

In one example, a circuit includes an input and an output. A current path extends between a first voltage supply terminal and a second voltage supply terminal. The current path includes a pull-up intermediate node, the output, and a pull-down intermediate node. A first pull-down transistor is coupled between the pull-down intermediate node and the first voltage supply terminal on the current path. The first pull-down transistor has a control terminal coupled to the input. A second pull-down transistor is coupled between the output and the pull-down intermediate node on the current path. The second pull-down transistor has a control terminal coupled to the input. A pull-up resistor is coupled between the second voltage supply terminal and the pull-up intermediate node on the current path. A pull-up transistor is coupled between the pull-up intermediate node and the output on the current path. The pull-up transistor has a control terminal coupled to the input. A hysteresis transistor is coupled between the pull-up intermediate node and the first voltage supply terminal. The hysteresis transistor has a control terminal coupled to the output. A clamp circuit is coupled between the first voltage supply terminal and the pull-down intermediate node. A magnitude of a threshold voltage of the first pull-down transistor is less than a magnitude of a threshold voltage of the pull-up transistor. A magnitude of a threshold voltage of the second pull-down transistor is less than the magnitude of the threshold voltage of the first pull-down transistor.

BRIEF DESCRIPTION OF THE DRAWINGS

The same reference numbers or other reference designators are used in the drawings to designate the same or similar (functionally and/or structurally) features.

DETAILED DESCRIPTION

The following description provides many different examples for implementing different features of the provided subject matter. Specific examples of components and arrangements are described below to simplify the present description. The drawings are not drawn to scale.

Figure 1:
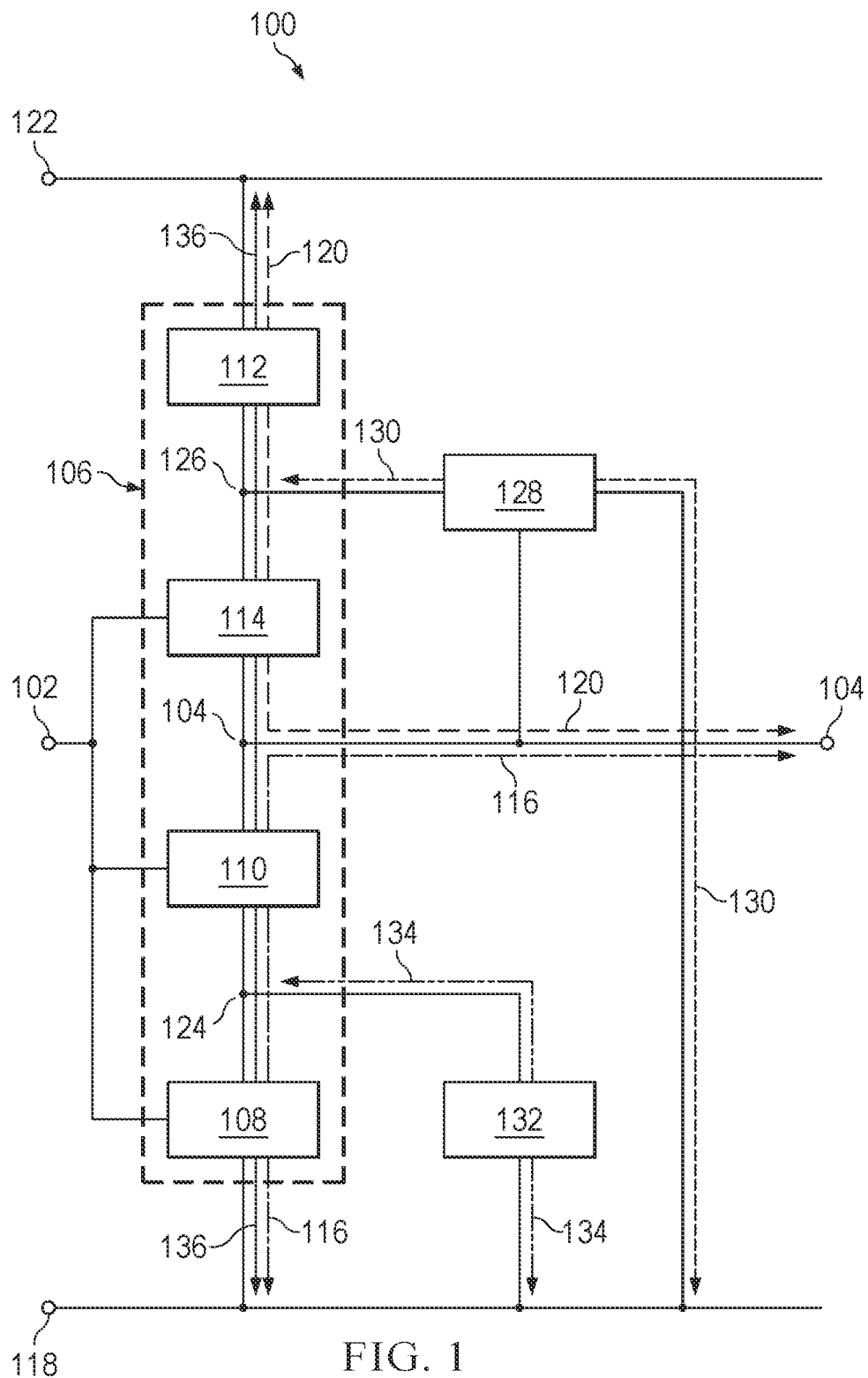
FIG. 1 is a block diagram of some examples of a circuit that includes a first inverter coupled between an input node and an inverting output node, a hysteresis transistor coupled to the first inverter, and a clamp circuit coupled to the first inverter.

FIG. 1 is a diagram of some examples of a circuit 100 that includes a first inverter 106 coupled between an input node 102 and an inverting output node 104, a hysteresis transistor 128 coupled to the first inverter 106, and a clamp circuit 132 coupled to the first inverter 106.

The first inverter 106 includes a first pull-down transistor 108, a second pull-down transistor 110, a pull-up resistor 112, and a pull-up transistor 114 along a first current path 136 that extends between a first voltage supply terminal 118 (e.g., a ground terminal) and a second voltage supply terminal 122 (e.g., a positive voltage supply terminal). The first current path includes a pull-down intermediate node 124, a pull-up intermediate node 126, and the inverting output node 104. The first pull-down transistor 108, the second pull-down transistor 110, and the pull-up transistor 114 are controlled by the input node 102. For example, the first pull-down transistor 108, the second pull-down transistor 110, and the pull-up transistor 114 each have a control terminal (e.g., a gate) that is coupled to the input node 102.

The first pull-down transistor 108 and the second pull-down transistor 110 are coupled in series along a pull-down path 116 that extends between the first voltage supply terminal 118 and the inverting output node 104. The pull-down intermediate node 124 is on the pull-down path 116 between the first pull-down transistor 108 and the second pull-down transistor 110. The pull-up resistor 112 and the pull-up transistor 114 are coupled in series along a pull-up path 120 that extends between the second voltage supply terminal 122 and the inverting output node 104. The pull-up intermediate node 126 is on the pull-up path 120 between the pull-up resistor 112 and the pull-up transistor 114.

The hysteresis transistor 128 is coupled to the first inverter 106 along a hysteresis path 130 that extends between the first voltage supply terminal 118 and the pull-up intermediate node 126. The hysteresis transistor 128 is controlled by the inverting output node 104. For example, the hysteresis transistor 128 has a control terminal (e.g., a gate) coupled to the inverting output node 104.

The clamp circuit 132 is coupled to the first inverter 106 along a clamp path 134 that extends between the first voltage supply terminal 118 and the pull-down intermediate node 124. In some examples, the clamp circuit 132 includes one or more diodes coupled in series between the pull-down intermediate node 124 and the first voltage supply terminal 118.

The first pull-down transistor 108 has a threshold voltage (Vt) that has a magnitude that is less than a magnitude of a threshold voltage of the pull-up transistor 114 and less than a magnitude of a threshold voltage of the hysteresis transistor 128. In some examples, the magnitude of the threshold voltage of the first pull-down transistor 108 is less than half of a maximum input voltage at the input node 102. The second pull-down transistor 110 has a threshold voltage that has a magnitude that is less than the magnitude of the threshold voltage of the first pull-down transistor 108. The pull-up resistor 112 is a temperature dependent resistor. For example, a resistance of the pull-up resistor 112 is inversely proportional to a temperature of the pull-up resistor 112. Thus, assuming similar circuit operating conditions, as the ambient temperature surrounding the circuit 100 increases, the temperature of the pull-up resistor 112 also tends to increase and the resistance of the pull-up resistor 112 decreases. Conversely, as the ambient temperature surrounding the circuit 100 decreases, the resistance of the pull-up resistor 112 increases.

In some examples, a voltage drop across the clamp circuit 132 is clamped to a clamp voltage. For example, the clamp circuit 132 limits a maximum voltage drop across the clamp circuit 132. Thus, the clamp circuit 132 limits a maximum voltage drop across the first pull-down transistor 108 because the clamp circuit 132 and the first pull-down transistor 108 are coupled in parallel between the pull-down intermediate node 124 and the first voltage supply terminal 118. In some examples, the maximum voltage drop (e.g., the clamp voltage) across the first pull-down transistor 108, as set by the clamp circuit 132, is approximately equal to a sum of threshold voltages of diode(s) in the clamp circuit 132. For example, if clamp circuit 132 includes two series-connected diodes (or two diode-connected transistors), the voltage drop across clamp circuit 132 is approximately 1.4 V.

Figure 2:
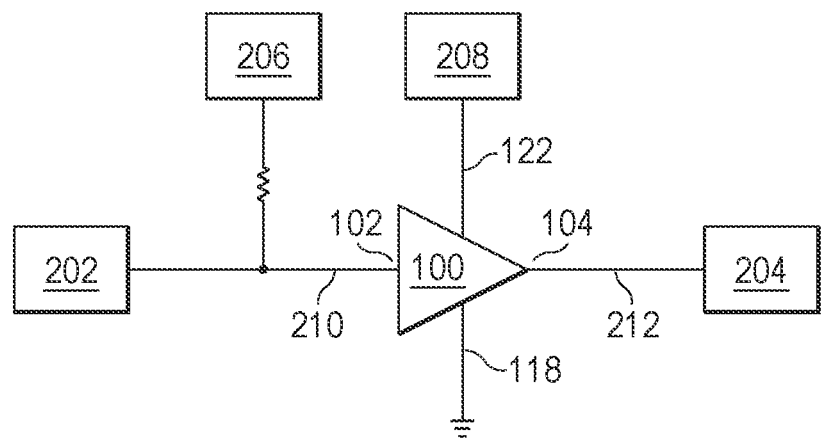
FIG. 2 is a block diagram of some examples of a system in which the circuit of FIG. 1 is coupled between logic circuitry and load circuitry.

In some examples, as shown in FIG. 2, the circuit 100 acts as a buffer circuit and is coupled between logic circuitry 202 and load circuitry 204. For example, the input node 102 of the circuit 100 is coupled to the logic circuitry 202 and the inverting output node 104 of the circuit 100 is coupled to the load circuitry 204. The circuit 100 may function as a wakeup receiver for the load circuitry 204. In some examples, an input signal 210 (having an input voltage magnitude) is provided to the input node 102 from the logic circuitry 202. Further, in some examples, an output signal 212 (having an output voltage magnitude) is provided to the load circuitry 204 from the inverting output node 104. In some examples, a logic voltage supply 206 is coupled to the logic circuitry 202 and the input node 102 of the circuit 100. A load voltage supply 208 is coupled to the second voltage supply terminal 122. In some examples, a voltage of the load voltage supply 208 is greater than a voltage of the logic voltage supply 206. For example, the voltage of the load voltage supply 208 is approximately 5 volts (e.g., 5 volts±20%) and the voltage at the logic voltage supply 206 is approximately 1.2 volts (e.g., 1.2 volts±10%).

Figure 3:
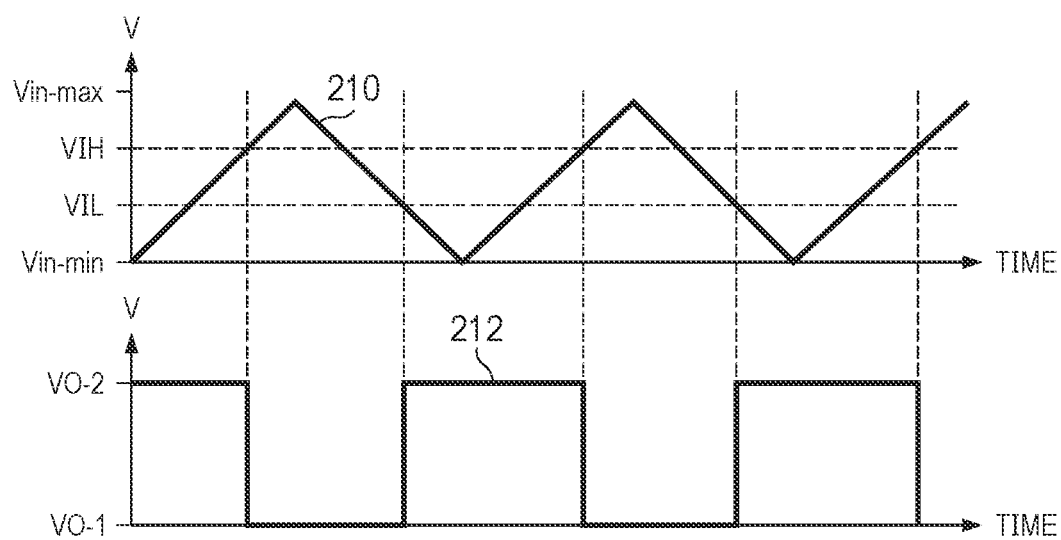
FIG. 3 is timing diagram of the circuit of FIG. 1.

In some examples, the circuit 100 operates similar to an inverting Schmitt trigger circuit. For example, as shown in FIG. 3, the voltage of the input signal 210 varies between the logic voltage supply maximum Vin-max (e.g., approximately 1.2 volts) and the logic voltage supply minimum Vin-min (e.g., zero volts). In response to the voltage of the input signal 210 rising above an upper input voltage threshold VIH, the voltage of the output signal 212 at the inverting output node 104 is pulled down to a low output voltage VO-1 (e.g., to ground via the first voltage supply terminal 118). Further, in response to the voltage of the input signal 210 falling below a lower input voltage threshold VIL, the voltage of the output signal 212 at the inverting output node 104 is pulled up to a high output voltage VO-2 (e.g., to approximately 5 volts via the second voltage supply terminal 122).

In some Schmitt trigger circuits, the pull-down transistors may have high threshold voltages (e.g., greater than half of the maximum input voltage) for reliability reasons. A challenge with these circuits is that they may not be able to meet some lower input voltage threshold VIL and upper input voltage threshold VIH requirements. For example, these circuits may have an upper input voltage threshold VIH of about 95% of the maximum input voltage Vin-max (e.g., 1.2 volts) because the threshold voltages of the pull-down transistors are high and thus the pull-down transistors require higher voltages to perform switching. Further, some industry standards (e.g., Joint Electron Device Engineering Council (JEDEC) standards) require a lower input voltage threshold VIL of about 30% of the maximum input voltage Vin-max and an upper input voltage threshold VIH of about 95% of the maximum input voltage Vin-max. Thus, such devices may fail to comply with some industry standards.

Further, in some circuits, instead of including the clamp circuit 132 between the first voltage supply terminal 118 and the pull-down intermediate node 124, a second hysteresis transistor is included along a second hysteresis path extending between the second voltage supply terminal 122 and the pull-down intermediate node 124. A challenge with these circuits is that replacing the high threshold voltage pull-down transistors with lower threshold voltage pull-down transistors to address the lower input voltage threshold VIL and upper input voltage threshold VIH issues may reduce the reliability of the circuit. For example, the low threshold voltage transistors may malfunction when they are exposed to the higher voltage (e.g., approximately 5 volts) of the load voltage supply 208 when the second hysteresis transistor turns on and couples the second voltage supply terminal 122 (e.g., at 5 volts) to the pull-down intermediate node 124.

In contrast, the circuit 100 of FIG. 1 is capable of reliably meeting industry standard lower input voltage threshold VIL and upper input voltage threshold VIH requirements (e.g., the JEDEC VIL at 30% of Vin-max and VIH at 70% of Vin-max requirements) using the load voltage supply 208. For example, by using low threshold voltage pull-down transistors (e.g., the first pull-down transistor 108 and the second pull-down transistor 110) on the pull-down path 116, the upper input voltage threshold VIH values of the circuit 100 can be improved. In particular, industry standard lower input voltage threshold VIL and upper input voltage threshold VIH requirements (e.g. VIL at 30% of Vin-max and VIH at 70% of Vin-max) can be achieved. In some examples, even further improved lower input voltage threshold VIL and upper input voltage threshold VIH levels (e.g. VIL at 35% of Vin-max and VIH at 65% of Vin-max) can be achieved. Further, by including the clamp circuit 132 between the first voltage supply terminal 118 and the pull-down intermediate node 124 (instead of a second hysteresis transistor between the pull-down intermediate node 124 and the second voltage supply terminal 122), the reliability of the circuit 100 may be improved. For example, because the second voltage supply terminal 122 is not coupled to the pull-down intermediate node 124 by a second hysteresis transistor and the clamp circuit 132 limits the maximum voltage drop across the first pull-down transistor 108, the likelihood of the first pull-down transistor 108 experiencing the high voltage of the load voltage supply 208 (e.g., approximately 5 volts) may be reduced. As a result, a likelihood of the first pull-down transistor 108 malfunctioning may be reduced and thus the reliability of the circuit 100 may be improved.

In addition, some circuits alternatively include a second pull-up transistor in place of the pull-up resistor 112 along the pull-up path 120. A challenge with these circuits is that they may not be able to meet the industry standard lower input voltage threshold VIL and upper input voltage threshold VIH requirements when a temperature of the circuit 100 fluctuates (e.g., due to ambient temperate changes or the like). In contrast, the circuit 100 of FIG. 1 is capable of meeting the industry standard lower input voltage threshold VIL and upper input voltage threshold VIH requirements even in the presence of temperature fluctuations. In particular, because the pull-up resistor 112 is a temperature dependent resistor having a resistance that changes based on temperature of the pull-up resistor 112, the circuit 100 can compensate for temperature fluctuations. Thus, by including the pull-up resistor 112 on the pull-up path 120 between the second voltage supply terminal 122 and the pull-up transistor 114 (instead of a second pull-up transistor), the circuit 100 can meet industry standard lower input voltage threshold VIL and upper input voltage threshold VIH requirements across varying temperatures.

Further, the circuit 100 of FIG. 1 can reliably meet the industry standard lower input voltage threshold VIL and upper input voltage threshold VIH values despite the logic voltage supply 206 and the load voltage supply 208 being variable. For example, the circuit 100 can meet the industry standard lower input voltage threshold VIL and upper input voltage threshold VIH values despite the logic voltage supply 206 varying by ±10% and the load voltage supply 208 varying by ±20%.

Some circuits address reliability issues associated with low threshold voltage pull-down transistors by coupling the second voltage supply terminal 122 to the lower, logic voltage supply (e.g., approximately 1.2 volts) instead of the higher, load voltage supply 208 (e.g., 5 volts). For example, in some circuits, the second voltage supply terminal 122 is coupled to the logic voltage supply 206 at an external pin of the circuit 100. A challenge with these circuits is that the external pin takes up additional area and thus a size of the circuit may be increased. Further, in some circuits, the logic voltage supply 206 may not be accessible, thereby making it difficult to couple the second voltage supply terminal 122 to the logic voltage supply 206 using an external pin.

Some other circuits address reliability issues associated with low threshold voltage pull-down transistors by including an internal voltage regulator which is coupled to the second voltage supply terminal 122 and is configured to internally generate a supply voltage that is similar to that of the logic voltage supply 206 (e.g., approximately 1.2 volts). A challenge with these circuits is that the internal voltage regulator takes up additional area and thus a size of the circuit may be increased. Further, these circuits may have an undesirable current when not in use (e.g., during "sleep mode") due to the operation of the internal voltage regulator when the circuit is not in use.

In contrast, the circuit 100 of FIG. 1 is capable of reliably meeting industry standard lower input voltage threshold VIL and upper input voltage threshold VIH using the load voltage supply 208 (e.g., the 5 volt supply) without needing an external pin to access to the logic voltage supply 206 (e.g., the 1.2 volt supply) and without needing a voltage regulator to generate a voltage similar to that of the logic voltage supply 206. Because the load voltage supply 208, which is readily available in many circuits, can be used without needing an external pin or an internal voltage regulator, the size of the circuit 100 may be reduced. Further, because the circuit 100 does not include an internal voltage regulator, the "sleep mode" current of the circuit 100 may be reduced.

Figure 4:
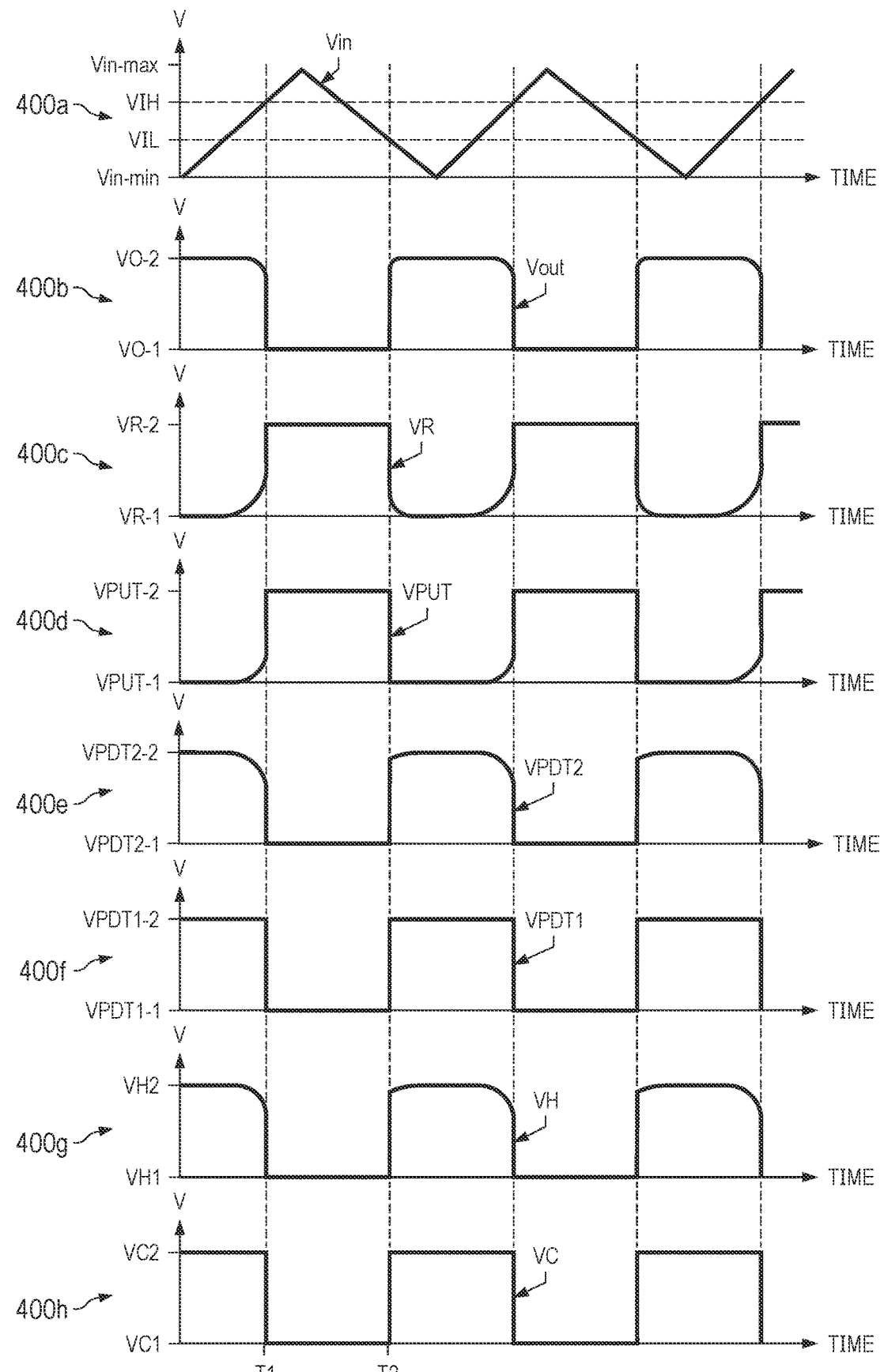
FIG. 4 is another timing diagram of the circuit of FIG. 1.

FIG. 4 is a timing diagram of the circuit 100 of FIG. 1. The timing diagram includes a first plot 400a that illustrates a voltage of the input signal 210 over time. The timing diagram incudes a second plot 400b that illustrates a voltage of the output signal 212 over time. The timing diagram incudes a third plot 400c that illustrates a voltage across the pull-up resistor 112 over time. The timing diagram incudes a fourth plot 400d that illustrates a voltage across the pull-up transistor 114 over time. The timing diagram incudes a fifth plot 400e that illustrates a voltage across the second pull-down transistor 110 over time. The timing diagram incudes a sixth plot 400f that illustrates a voltage across the first pull-down transistor 108 over time. The timing diagram incudes a seventh plot 400g that illustrates a voltage across the hysteresis transistor 128 over time. The timing diagram incudes an eighth plot 400h that illustrates a voltage across the clamp circuit 132 over time.

At a first time T1, the voltage of the input signal (Vin) (e.g., the voltage at the input node 102) rises above the upper input voltage threshold VIH. In response, the voltage across the pull-up resistor 112 (VR) rises from a low resistor voltage (VR-1) to a high resistor voltage (VR-2); the voltage across the pull-up transistor 114 (VPUT) (e.g., the voltage difference between the drain and source of the transistor) rises from a low pull-up voltage (VPUT-1) to a high pull-up voltage (VPUT-2) (e.g., the pull-up transistor 114 transitions from "ON" to "OFF"); the voltage across the second pull-down transistor 110 (VPDT2) drops from a second high pull-up voltage (VPDT2-2) to a second low pull-down voltage (VPDT2-1) (e.g., the second pull-down transistor 110 transitions from "OFF" to "ON"); the voltage across the first pull-down transistor 108 (VDPT1) drops from a first high pull-up voltage (VPDT1-2) to a first low pull-down voltage (VPDT1-1) (e.g., the first pull-down transistor 108 transitions from "OFF" to "ON"); the voltage across the hysteresis transistor 128 (VH) drops from a high hysteresis voltage (VH-2) to a low hysteresis voltage (VH-1) (e.g., the hysteresis transistor 128 transitions from "OFF" to "ON"); and the voltage across the clamp circuit 132 (VC) drops from a high clamp voltage (VC-2) to a low clamp voltage (VC-1). As a result of this switching, the voltage of the output signal 212 (Vout) (e.g., the voltage at the inverting output node 104) drops from a high output voltage (VO-2) (e.g., 5 volts) to a low output voltage (VO-1) (e.g., 0 volts).

At a second time T2, the voltage of the input signal (Vin) (e.g., the voltage at the input node 102) drops below the lower input voltage threshold VIL. In response, the voltage across the pull-up resistor 112 (VR) drops from the high resistor voltage (VR-2) to the low resistor voltage (VR-1); the voltage across the pull-up transistor 114 (VPUT) drops from the high pull-up voltage (VPUT-2) to the low pull-up voltage (VPUT-1) (e.g., the pull-up transistor 114 transitions from "OFF" to "ON"); the voltage across the second pull-down transistor 110 (VPDT2) rises from the second low pull-up voltage (VPDT2-1) to the second high pull-down voltage (VPDT2-2) (e.g., the second pull-down transistor 110 transitions from "ON" to "OFF"); the voltage across the first pull-down transistor 108 (VPDT1) rises from the first low pull-up voltage (VPDT1-1) to the first high pull-down voltage (VPDT1-2) (e.g., the first pull-down transistor 108 transitions from "ON" to "OFF"); the voltage across the hysteresis transistor 128 (VH) rises from the low hysteresis voltage (VH-1) to the high hysteresis voltage (VH-2) (e.g., the hysteresis transistor 128 transitions from "ON" to "OFF"); and the voltage across the clamp circuit 132 (VC) rises from the low clamp voltage (VC-1) to the high clamp voltage (VC-2). As a result of this switching, the voltage of the output signal 212 (e.g., the voltage at the inverting output node 104) rises from the low output voltage (VO-1) (e.g., 0 volts) to the high output voltage (VO-2) (e.g., 5 volts).

Figure 5:
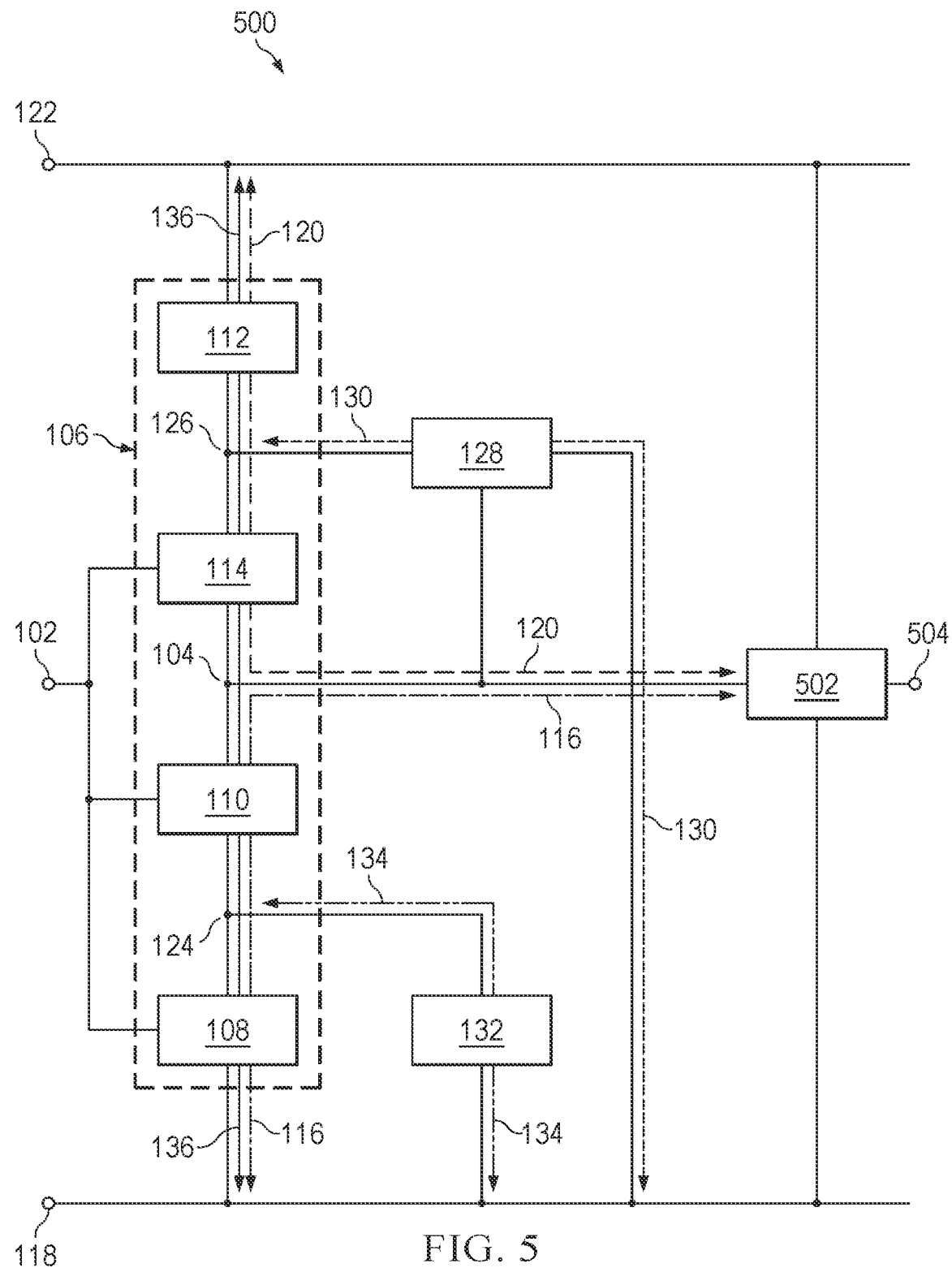
FIG. 5 is a block diagram of some examples of a circuit similar to the circuit of FIG. 1 in which a second inverter is coupled between the inverting output node and a non-inverting output node.

FIG. 5 is a diagram of some examples of a circuit 500 similar to the circuit 100 of FIG. 1 in which a second inverter 502 is coupled between the inverting output node 104 and a non-inverting output node 504.

In some examples, the second inverter 502 is coupled to the first voltage supply terminal 118 and the second voltage supply terminal 122. A control terminal of the second inverter 502 is coupled to the inverting output node 104. An output of the second inverter 502 is coupled to the non-inverting output node 504. The second inverter 502 is configured to invert the signal at the inverting output node 104. For example, when the voltage at the inverting output node 104 is low, the second inverter 502 couples the non-inverting output node 504 to the second voltage supply terminal 122 and thus the voltage at the non-inverting output node 504 is pulled up high (e.g., to 5 volts). Similarly, when the voltage at the inverting output node 104 is high, the second inverter 502 couples the non-inverting output node 504 to the first voltage supply terminal 118 and thus the voltage at the non-inverting output node 504 is pulled low (e.g., to ground).

By including the second inverter 502 in the circuit 500, the circuit operates similar to a non-inverting Schmitt trigger. For example, when the voltage at the input node 102 rises above the upper input voltage threshold VIH, the voltage at the non-inverting output node 504 is high. Similarly, when the voltage at the input node 102 voltage drops below the lower input voltage threshold VIL, the voltage at the non-inverting output node 504 is low.

Figure 6:
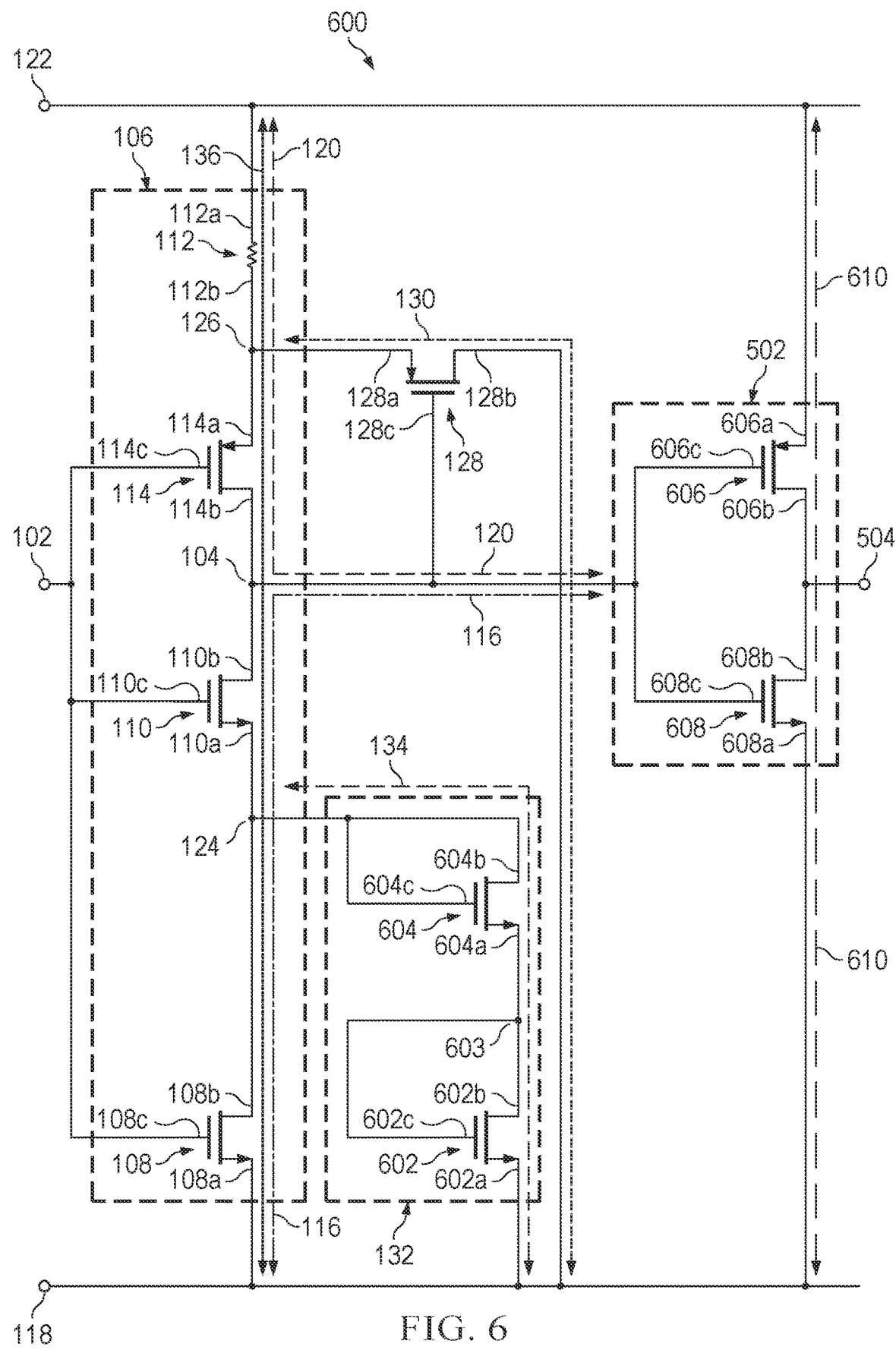
FIG. 6 is a circuit diagram of an example implementation, using metal-oxide-semiconductor field-effect transistors (MOSFETs), of the circuit of FIG. 5.

Circuit 600 in FIG. 6 is an example implementation of circuit 500 of FIG. 5. The transistors in circuit 600 are metal-oxide-semiconductor field-effect transistors (MOSFETs). Specifically, transistors 108, 110, 602, 604 and 608 are n-channel MOSFETs (referred to as nMOS devices or nMOSFETs), and transistors 114, 128 and 606 are p-channel MOSFETs (referred to as pMOS devices or pMOSFETs).

In some examples, the first pull-down transistor 108 has a source 108a coupled to the first voltage supply terminal 118, a drain 108b coupled to the pull-down intermediate node 124, and a gate 108c coupled to the input node 102. The second pull-down transistor 110 has a source 110a coupled to the pull-down intermediate node 124, a drain 110b coupled to the inverting output node 104, and a gate 110c coupled to the input node 102. The pull-up resistor 112 has a first node 112a coupled to the second voltage supply terminal 122 and a second node 112b coupled to the pull-up intermediate node 126. The pull-up transistor 114 has a source 114a coupled to the pull-up intermediate node 126, a drain 114b coupled to the inverting output node 104, and a gate 114c coupled to the input node 102. The hysteresis transistor 128 has a source 128a coupled to the pull-up intermediate node 126, a drain 128b coupled to the first voltage supply terminal 118, and a gate 128c coupled to the inverting output node 104.

In some examples, the clamp circuit 132 includes a first clamp transistor 602 and a second clamp transistor 604 coupled in series between the pull-down intermediate node 124 and the first voltage supply terminal 118. The first clamp transistor 602 and the second clamp transistor 604 are diode-connected transistors. For example, the first clamp transistor 602 has a source 602a coupled to the first voltage supply terminal 118, a drain 602b coupled to a clamp intermediate node 603, and a gate 602c coupled to the clamp intermediate node 603. The second clamp transistor 604 has a source 604a coupled to the clamp intermediate node 603, a drain 604b coupled to the pull-down intermediate node 124, and a gate 604c coupled to the pull-down intermediate node 124. In some examples, the voltage difference between the pull-down intermediate node 124 and the first voltage supply terminal 118 (e.g., the ground terminal) is approximately equal to the sum of the threshold voltage of the first clamp transistor 602 and the threshold voltage of the second clamp transistor 604. In some examples, the threshold voltage of the first clamp transistor 602 is different than the threshold voltage of the second clamp transistor 604. In some instances, by using clamp transistors having different threshold voltages, the voltage across the first pull-down transistor 108, as limited by the clamp circuit 132, can be tuned (e.g., increased or decreased). For example, the voltage across the first pull-down transistor 108 can be controlled by controlling the threshold voltages of the two clamp transistors. Although the clamp circuit 132 is illustrated as including two clamp transistors, it will be appreciated that some other number (e.g., one, three, four, etc.) of clamp transistors may alternatively be included in some other examples to achieve a desired voltage across the clamp circuit 132 and the first pull-down transistor 108. In other examples, transistors 602 and/or 604 may be replaced with one or more diodes.

In some examples, the second inverter 502 includes a pull-up transistor 606 and a pull-down transistor 608 coupled in series along a second current path 610 that extends between the second voltage supply terminal 122 and the first voltage supply terminal 118. The pull-up transistor 606 of the second inverter 502 has a source 606a coupled to the second voltage supply terminal 122, a drain 606b coupled to the non-inverting output node 504, and a gate 606c coupled to the inverting output node 104. The pull-down transistor 608 of the second inverter 502 has a source 608a coupled to the first voltage supply terminal 118, a drain 608b coupled to the non-inverting output node 504, and a gate 608c coupled to the inverting output node 104. Thus, when the voltage at the inverting output node 104 is high, the pull-down transistor 608 switches "ON" and the pull-up transistor 606 switches "OFF" so that the non-inverting output node 504 is coupled to the first voltage supply terminal 118 and pulled down (e.g., to ground). Similarly, when the voltage at the inverting output node 104 is low, the pull-down transistor 608 switches "OFF" and the pull-up transistor 606 switches "ON" so that the non-inverting output node 504 is coupled to the second voltage supply terminal 122 and pulled up (e.g., to approximately 5 volts).

In some examples, a magnitude of the threshold voltage of the first pull-down transistor 108 is less than half of the input voltage maximum Vin-max. In some examples, the magnitude of the threshold voltage of the first pull-down transistor 108 is less than 600 millivolts, less than 500 millivolts, less than 400 millivolts, or some other suitable value. In some examples, magnitudes of the threshold voltages of pull-up transistor 114, hysteresis transistor 128, pull-up transistor 606, and pull-down transistor 608 are in a range of about 600 millivolts to about 1000 millivolts, about 650 millivolts to about 850 millivolts, or some other suitable range. In some examples, a magnitude of the threshold voltage of the first clamp transistor 602 is less than 600 millivolts, less than 500 millivolts, less than 400 millivolts, or some other suitable value and a magnitude of the threshold voltage of the second clamp transistor 604 is in a range of about 600 millivolts to about 1000 millivolts, about 650 millivolts to about 850 millivolts, or some other suitable range, or vice versa. In some examples, the second pull-down transistor 110 is a native threshold voltage transistor having a threshold voltage of approximately zero volts. In some examples, the resistance of the pull-up resistor ranges from 155 kiloohms to 145 kiloohms or some other suitable range based on the temperature of the pull-up resistor 112 when the temperature of the pull-up resistor 112 ranges from −40 degrees Celsius to 150 degrees Celsius or some other suitable range, respectively.

In some examples, a drain-to-source voltage (VDS) rating (e.g., a maximum drain-to-source voltage which a transistor is configured to be subjected to without experiencing a substantial reduction in reliability) of the first pull-down transistor 108 is less than the voltage at the second voltage supply terminal 122 (e.g., 5 volts). For example, the VDS rating of the first pull-down transistor 108 may be approximately 1.8 volts or some other suitable value. In some examples, the VDS rating of the second pull-down transistor 110 is greater than the VDS rating of the first pull-down transistor 108 and approximately equal to the voltage at the second voltage supply terminal 122. For example, the VDS rating of the second pull-down transistor 110 may be approximately 5 volts or some other suitable value. By including the second pull-down transistor 110 (having the higher VDS rating) between the first pull-down transistor 108 (having the lower VDS rating) and the second voltage supply terminal 122, a reliability of the circuit may be improved. For example, because the second pull-down transistor 110 has a high VDS rating and because the second pull-down transistor 110 is between the first pull-down transistor 108 and the second voltage supply terminal 122, a likelihood of the first pull-down transistor 108 experiencing the high voltage (e.g., 5 volts) of the load voltage supply 208 may be reduced. As a result, a likelihood of the first pull-down transistor 108 malfunctioning due to being exposed to a voltage higher than the VDS rating of the first pull-down transistor 108 can be reduced. Thus, a reliability of the circuit can be improved. Further, because the threshold voltage of the second pull-down transistor 110 is lower than the threshold voltage of the first pull-down transistor 108, the upper input voltage threshold VIH value of the circuit 100 may not be impacted.

In some examples, the VDS rating of the pull-up transistor 114 and the VDS rating of the hysteresis transistor 128 are approximately equal to the voltage at the second voltage supply terminal 122 (e.g., 5 volts). In some examples, the first pull-down transistor 108, the second pull-down transistor 110, and the pull-down transistor 608 of the second inverter 502 are NMOS transistors (e.g., n-channel MOSFETs) or the like. In some examples, the pull-up transistor 114, the hysteresis transistor 128, and the pull-up transistor 606 of the second inverter 502 are PMOS transistors (e.g., p-channel MOSFETs) or the like. Although the transistors shown in FIG. 6 are illustrated and described as being MOSFETs, in some other examples the transistors can alternatively be corresponding bipolar junction transistors (BJTs), junction field-effect transistors (JFETs), or some other suitable transistors.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other implementations are possible, within the scope of the claims.

What is claimed is:

1. A circuit comprising:
    an inverter including:
        a first pull-down transistor having a control terminal and first and second terminals, the first terminal adapted to be coupled to a first voltage supply terminal;
        a second pull-down transistor having a control terminal and first and second terminals, the first terminal of the second pull-down transistor coupled to the second terminal of the first pull-down transistor;
        a pull-up resistor having first and second terminals, the first terminal of the pull-up resistor adapted to be coupled to a second voltage supply terminal; and
        a pull-up transistor having a control terminal and first and second terminals, the first terminal of the pull-up transistor coupled to the second terminal of the pull-up resistor, the second terminal of the pull-up transistor coupled to the second terminal of the second pull-down transistor, the control terminals of the first and second pull-down transistors and the pull-up transistor coupled together;
    a hysteresis transistor having a control terminal and first and second terminals, the control terminal of the hysteresis transistor coupled to the second terminals of the pull-up transistor and the second pull-down transistor, the first terminal of the hysteresis transistor coupled to the second terminal of the pull-up resistor and to the first terminal of the pull-up transistor, the second terminal of the hysteresis transistor coupled to the first terminal of the first pull-down transistor; and
    a clamp circuit having a first terminal coupled to the first terminal of the first pull-down transistor and having a second terminal coupled to the second terminal of the first pull-down transistor.

2. The circuit of claim 1, wherein the clamp circuit includes a first diode and a second diode coupled in series between the first and second terminals of the first pull-down transistor.

3. The circuit of claim 1, wherein the clamp circuit includes a first diode-connected transistor and a second diode-connected transistor coupled in series between the first and second terminals of the first pull-down transistor, the first diode-connected transistor having a first threshold voltage and the second diode-connected transistor having a second threshold voltage that differs from the first threshold voltage.

4. The circuit of claim 1, wherein a resistance of the pull-up resistor is inversely proportional to a temperature of the pull-up resistor.

5. The circuit of claim 1, wherein a threshold voltage of the first pull-down transistor is less than a threshold voltage of the pull-up transistor, and a threshold voltage of the second pull-down transistor is less than the threshold voltage of the first pull-down transistor.

6. The circuit of claim 1, wherein the inverter is a first inverter, and wherein the circuit further comprises:
    a second inverter having a first terminal coupled to the control terminal of the hysteresis transistor and to the second terminals of the pull-up transistor and the second pull-down transistor, having a second terminal coupled to the first terminal of the pull-up transistor, and having a third terminal coupled to the first terminal of the first pull-down transistor.

7. The circuit of claim 1, wherein the first voltage supply terminal is adapted to receive a first voltage, the second voltage supply terminal is adapted to receive a second voltage, greater than the first voltage, and the input is configured to receive an input voltage, less than the second voltage.

8. A system comprising:
a logic circuit adapted to be coupled to a first voltage supply;
a load circuit; and
a buffer circuit coupled between the logic circuit and the load circuit, the buffer circuit including:
an inverter including:
a first pull-down transistor having a control terminal and first and second terminals, the first terminal adapted to be coupled to a second voltage supply;
a second pull-down transistor having a control terminal and first and second terminals, the first terminal of the second pull-down transistor coupled to the second terminal of the first pull-down transistor;
a pull-up resistor having first and second terminals, the first terminal of the pull-up resistor adapted to be coupled to a third voltage supply that provides a voltage higher than a voltage of the first voltage supply; and
a pull-up transistor having a control terminal and first and second terminals, the first terminal of the pull-up transistor coupled to the second terminal of the pull-up resistor, the second terminal of the pull-up transistor coupled to the second terminal of the second pull-down transistor, the control terminals of the first and second pull-down transistors and the pull-up transistor coupled together, wherein a threshold voltage of the first pull-down transistor is less than a threshold voltage of the pull-up transistor, and a threshold voltage of the second pull-down transistor is less than the threshold voltage of the first pull-down transistor;
a hysteresis transistor having a control terminal and first and second terminals, the control terminal of the hysteresis transistor coupled to the second terminals of the pull-up transistor and the second pull-down transistor, the first terminal of the hysteresis transistor coupled to the second terminal of the pull-up resistor and to the first terminal of the pull-up transistor, the second terminal of the hysteresis transistor coupled to the first terminal of the first pull-down transistor; and
a clamp circuit having a first terminal coupled to the first terminal of the first pull-down transistor and having a second terminal coupled to the second terminal of the first pull-down transistor.

9. The system of claim 8, wherein a resistance of the pull-up resistor is inversely proportional to a temperature of the pull-up resistor.

10. The system of claim 8, wherein the clamp circuit includes a first diode-connected transistor and a second diode-connected transistor coupled in series between the first and second terminals of the first pull-down transistor.

11. The system of claim 8, wherein the inverter is a first inverter, and wherein the buffer circuit further includes a second inverter having a first terminal coupled to the control terminal of the hysteresis transistor and to the second terminals of the pull-up transistor and the second pull-down transistor, having a second terminal coupled to the first terminal of the pull-up transistor, and having a third terminal coupled to the first terminal of the first pull-down transistor.

12. The system of claim 8, wherein of the threshold voltage of the pull-up transistor is less than a threshold voltage of the hysteresis transistor.

13. A circuit comprising:
a first transistor having a control terminal and first and second terminals, the first terminal adapted to be coupled to a first voltage supply terminal;
a second transistor having a control terminal and first and second terminals, the first terminal of the second transistor coupled to the second terminal of the first transistor;
a resistor having first and second terminals, the first terminal of the resistor adapted to be coupled to a second voltage supply terminal;
a third transistor having a control terminal and first and second terminals, the first terminal of the third transistor coupled to the second terminal of the resistor, the second terminal of the third transistor coupled to the second terminal of the second transistor, the control terminals of the first, second, and third transistors coupled together;
a fourth transistor having a control terminal and first and second terminals, the control terminal of the fourth transistor coupled to the second terminals of the second and third transistors, the first terminal of the fourth transistor coupled to the second terminal of the resistor and to the first terminal of the third transistor, the second terminal of the fourth transistor coupled to the first terminal of the first transistor; and
a clamp circuit having a first terminal coupled to the first terminal of the first transistor and having a second terminal coupled to the second terminal of the first transistor.

14. The circuit of claim 13, wherein the clamp circuit includes a first diode-connected transistor and a second diode-connected transistor coupled in series between the first and second terminals of the first transistor.

15. The circuit of claim 13, wherein the first transistor has a threshold voltage less than a threshold voltage of the third transistor.

16. The circuit of claim 13, wherein the resistor has a resistance that is inversely proportional to temperature.

17. The circuit of claim 13, wherein the first transistor has a threshold voltage less than a threshold voltage of the fourth transistor.

18. The circuit of claim 13, wherein the threshold voltage of the first transistor is less than half of a maximum voltage provided to the control terminals of the first, second, and third transistors.

19. The circuit of claim 13, wherein a threshold voltage of the second transistor is less than the threshold voltage of the first transistor.

20. The circuit of claim 13, wherein the second voltage supply terminal is adapted to receive a voltage that is greater than a maximum voltage provided to the control terminals of the first, second, and third transistors.

* * * * *